(12) United States Patent
Dykstra et al.

(10) Patent No.: US 10,878,145 B2
(45) Date of Patent: Dec. 29, 2020

(54) BOTTOMHOLE ASSEMBLY DESIGN AND COMPONENT SELECTION

(71) Applicant: Halliburton Energy Services, Inc., Houston, TX (US)

(72) Inventors: Jason D. Dykstra, Spring, TX (US); Venkata Madhukanth Vadali, Houston, TX (US); Xingyong Song, Houston, TX (US); Yiming Zhao, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 411 days.

(21) Appl. No.: 15/777,167

(22) PCT Filed: Dec. 29, 2015

(86) PCT No.: PCT/US2015/067869
§ 371 (c)(1),
(2) Date: May 17, 2018

(87) PCT Pub. No.: WO2017/116417
PCT Pub. Date: Jul. 6, 2017

(65) Prior Publication Data
US 2018/0373823 A1    Dec. 27, 2018

(51) Int. Cl.
*G06F 17/50* (2006.01)
*G06F 30/20* (2020.01)
(Continued)

(52) U.S. Cl.
CPC .............. *G06F 30/20* (2020.01); *E21B 7/00* (2013.01); *E21B 7/04* (2013.01); *E21B 41/0092* (2013.01); *G01V 11/00* (2013.01)

(58) Field of Classification Search
CPC ............ E21B 7/00; G01V 11/00; G06F 30/20
(Continued)

(56) References Cited

U.S. PATENT DOCUMENTS 6,697,788 B1    2/2004  Fukuda et al.
7,953,586 B2    5/2011  Chen et al.
(Continued)

FOREIGN PATENT DOCUMENTS

EP          2108166 B1        6/2013
WO    WO 2008/097303 A2      8/2008
WO    WO-2015060810 A1       4/2015

OTHER PUBLICATIONS

Office Action issued for Canadian Patent Application No. 2,997,717, dated Nov. 6, 2019, 4 pages.
(Continued)

*Primary Examiner* — Andre Pierre Louis
(74) *Attorney, Agent, or Firm* — Haynes and Boone, LLP

(57) ABSTRACT

A method for generating a BHA design and component selection by creating a plurality of BHA configurations. A cost function, representative of each respective BHA configuration, is determined. Each cost function includes drilling process metrics. A final BHA configuration of the plurality of BHA configurations is selected having an optimal cost function value. The optimal cost function value may be defined as a cost function value that is less than cost function values of other respective cost functions for the plurality of BHA configurations.

15 Claims, 7 Drawing Sheets

(51) Int. Cl.
  *E21B 41/00*  (2006.01)
  *G01V 11/00*  (2006.01)
  *E21B 7/04*  (2006.01)
  *E21B 7/00*  (2006.01)

(58) Field of Classification Search
  USPC .................................................. 703/1, 9, 10
  See application file for complete search history.

(56) References Cited

U.S. PATENT DOCUMENTS

| | | | |
|---|---|---|---|
| 2004/0256152 | A1* | 12/2004 | Dashevskiy ............ E21B 44/00 175/25 |
| 2005/0071120 | A1 | 3/2005 | Hutchinson |
| 2006/0151214 | A1 | 7/2006 | Prange et al. |
| 2006/0195307 | A1 | 8/2006 | Huang et al. |
| 2011/0077924 | A1 | 3/2011 | Ertas et al. |
| 2011/0214878 | A1 | 9/2011 | Bailey et al. |
| 2014/0309978 | A1 | 10/2014 | Chen et al. |
| 2015/0088468 | A1 | 3/2015 | Hohl et al. |
| 2015/0105912 | A1 | 4/2015 | Dykstra |
| 2015/0233229 | A1* | 8/2015 | Benson ................... E21B 47/06 700/275 |

OTHER PUBLICATIONS

Korean Intellectual Property Office, PCT/US2015/067869, International Search Report and Written Opinion, dated Sep. 29, 2016, 18 pages, Korea.
Intellectual Property Office, GB1617672.9, Search and Examination Repor, dated Feb. 7, 2018, 6 pages, London.
Intellectual Property Office, GB1617672.9, Search and Examination Report, dated Feb. 27, 2017, 9 pages, London.

* cited by examiner

BOTTOMHOLE ASSEMBLY DESIGN AND COMPONENT SELECTION

CROSS-REFERENCE TO RELATED APPLICATIONS

This application is a U.S. national stage patent application of International Patent Application No. PCT/US2015/067869, filed on Dec. 29, 2015 the benefit of which is claimed and the disclosure of which is incorporated herein by reference in its entirety.

BACKGROUND

A bottomhole assembly (BHA) may be used for directional drilling of a borehole in almost any direction. The drilling direction of the BHA may be controlled by controlling orientation of the drill bit and/or applied side forces at the bit.

One challenge related to directional drilling is the design of the BHA. The BHA design has an impact on drilling performance and the lifespan of the BHA. In particular, the BHA design determines the various vibration modes of the BHA and also affects the wear rate of the BHA components. For example, if the natural frequencies of the BHA design coincide with expected frequencies of downhole forces, the BHA may resonate, resulting in damage or failure of the BHA.

DETAILED DESCRIPTION

Directional drilling is the practice of drilling a wellbore using a hydro-electromechanical system (i.e., BHA) that provides control of the drill bit orientation or applied side forces at the bit thereby allowing drilling along a controlled path in almost any direction. One challenge related to directional drilling is the design of the BHA. The design and component configuration of the BHA has an impact on the performance of drilling as well as the life cycle of the BHA.

For example, resonating frequencies of a poorly designed BHA, when excited, may result in failure of the BHA. Thus, the BHA should be designed such that the natural frequencies of the BHA do not coincide with expected frequencies of downhole forces. Also, the location and number of stabilizers to be used may affect the whirl and additional contact forces acting on the BHA. The BHA design may also affect the wear rate of the various BHA components. This is an important aspect of BHA design since replacing a worn out or broken downhole component is time consuming and expensive. Another important challenge includes the decision of sensor placement along the BHA. A suitable location for sensors determines the measurability and accuracy of the physical state of interests. Further, accurate placement of sensors is necessary to develop control algorithms for the BHA.

Some of the challenges noted above, as well as others, may be addressed by implementing a method for BHA design and component selection. The method, operating in either the time domain or the frequency domain, selects the best BHA configuration for a particular job given the type of formation and selected performance requirements. Thus, the method may reduce downhole vibrations and component wear while improving rate of penetration. For example, the method generally may create a plurality of BHA configurations, determine a cost function representative of each respective BHA configuration, each cost function comprising drilling process metrics, and select a final BHA configuration of the plurality of BHA configurations having an optimal cost function value, wherein the optimal cost function value is less than cost function values of other respective cost functions for the plurality of BHA configurations.

Figure 1:
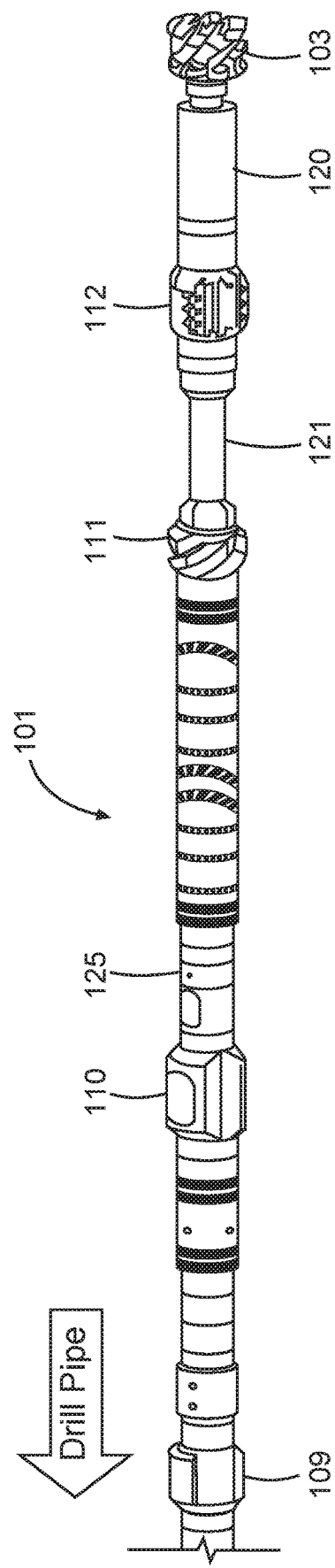
FIG. 1 is a diagram showing an embodiment of a BHA configuration, according to various examples.

FIG. 1 is a diagram showing an embodiment of a BHA configuration, according to various embodiments. The various elements and locations of the elements in the BHA are for purposes of illustration only. Other embodiments may employ different BHA elements and locations of those elements than shown.

A sensor package 101 may be selected for downhole measurements. For example, the sensor package 101 may include the various sensors and circuits (e.g., gyroscopes and accelerometers for inertial measurements, pressure gauges, strain gauges, thermocouples, telemetry, shock, vibration) used during measurement while drilling (MWD) operations with the BHA as part of a drill string. The MWD operations may be used while drilling to determine inclination and/or direction of the drilling operation. Further the sensor package may also include electronics to store the sensor measurements, known as logging while drilling (LWD).

The sensor package 101 may also include drill collars 125 and/or stabilizers 110. One or more drill collars 125 may be used to provide additional weight on bit (WOB) for drilling.

The BHA may also include stabilizers 109-112 in other locations of the BHA than the sensor package 101. The primary purpose of the stabilizers, as evident from the name, is to stabilize the BHA within the borehole, reduce vibrations, restrict lateral movement, and provide support forces.

A rotary steerable system (RSS) 120 is a component used to steer the attached drill bit 103 in directional drilling. The RSS 120 may be controlled from the surface by telemetry or pre-programmed to control the steering of the drill bit 103 by push-the-bit or point-the-bit operations. The drill bit 103 may be pointed in a preferred direction by flexing the drive shaft within the RSS 120 using a pair of eccentric rings controlled by a complex hydro-electro-mechanical system. By controlling the amount of bending of the shaft, the bit can be pointed in the desired direction.

A flex sub 121 is a flexible joint that may be used to allow flexing and bending of the BHA and certain locations. Other components that are not shown or discussed may also make up the BHA. For example, shock subs, underreamers, inline reamers as well as other components may be used in a BHA and selected by the subsequently discussed methods for BHA design.

A dynamic model of the drilling process is used in both the time domain and frequency domain embodiments. The model simulates drilling operating conditions to determine the downhole conditions and the effects on the BHA. The model may be date based, physics based, or a combination of both.

The data based dynamic model may use empirical data to derive the model. For example, logging data for vibration, rate of penetration, and other forces resulting from particular drilling parameters (e.g., weight-on-bit, torque-on-bit, frictional forces) may be used to generate the model.

The physics-based model may use a lumped parameter model. In such a model, the drilling system, including the BHA, is modeled as a lumped spring mass system and may be described mathematically by:

$$M \begin{bmatrix} \ddot{x} \\ \ddot{y} \\ \ddot{z} \\ \ddot{\alpha} \\ \ddot{\beta} \\ \ddot{\gamma} \end{bmatrix} + C \begin{bmatrix} \dot{x} \\ \dot{y} \\ \dot{z} \\ \dot{\alpha} \\ \dot{\beta} \\ \dot{\gamma} \end{bmatrix} + K \begin{bmatrix} x \\ y \\ z \\ \alpha \\ \beta \\ \gamma \end{bmatrix} = \overline{F}$$

wherein x, y, z, $\alpha$, $\beta$, and $\gamma$ represent the position and attitude vectors of the lumped masses, Al, C, and K represent the inertia, damping, and stiffness matrices, respectively, derived from the geometric and material properties of each component, and $\overline{F}$ represents the force vector of the forces acting on the drilling system.

The x, y, and z represent the position vectors in Cartesian coordinates of a BHA component. The $\dot{x}$, $\dot{y}$, and $\dot{z}$ represent the first derivative of these coordinates and the $\ddot{x}$, $\ddot{y}$, and $\ddot{z}$ position vectors represent the second derivative of these coordinates.

The $\alpha$, $\beta$, and $\gamma$ vectors represent three possible rotational attitudes of each BHA component at the particular location specified by the x, y, and z position. The $\dot{\alpha}$, $\dot{\beta}$, and $\dot{\gamma}$ vectors represent the first derivative of these vectors and the $\ddot{\alpha}$, $\ddot{\beta}$, and $\ddot{\gamma}$ vectors represent the second derivative of these vectors. Although a Cartesian coordinate systems is used in this example, the model may be developed in any other coordinate systems or a transformation of the same.

The force vector $\overline{F}$ thus includes the forces acting on the drilling system. These forces may include torque from a top drive, hook load, weight-on-bit, torque-on-bit, frictional contact forces, non-linear bit rock interactions, hydraulic interaction forces, gravity, as well as other forces.

Figure 2:
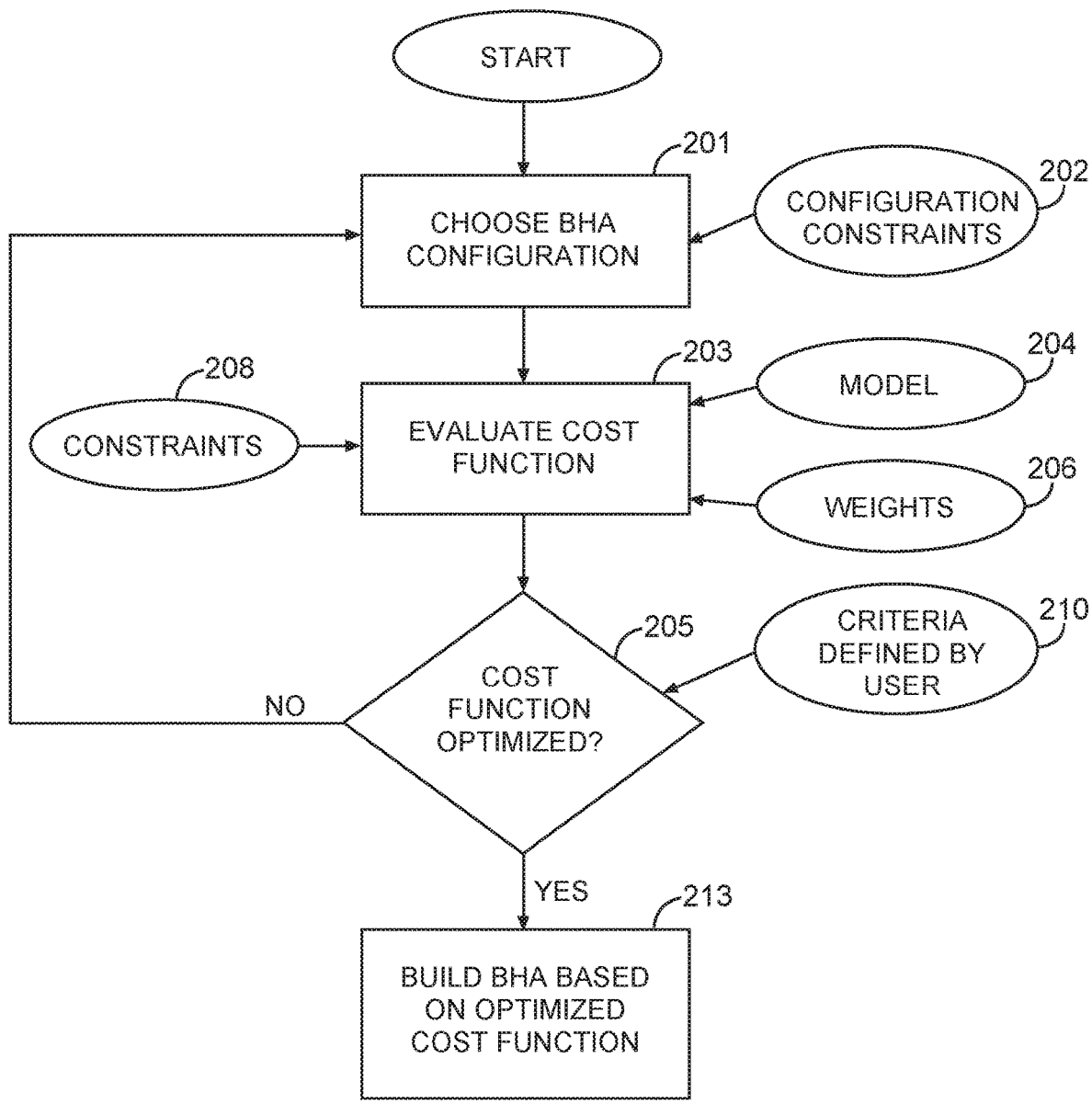
FIG. 2 is a flowchart of a method for BHA design in the time domain, according to various examples.

FIG. 2 is a flowchart of a method for BHA design in the time domain, according to various embodiments. This method uses an optimized cost function that uses the dynamic model (e.g., physics-based and/or data-based) to estimate vibrations, measurability, controllability, predict wear on components, determine mechanical specific energy (MSE), or other parameters.

In block 201, an example BHA configuration is generated. This configuration may include types of BHA components and locations of those components. For example, FIG. 1 is one example of a BHA configuration.

One or more configuration constraints 202 (e.g., expected operating region) may be input to the BHA configuration generation. The expected operating region may be defined based on a type of geological formation to be drilled, a position of the drill bit (e.g., Total Vertical Depth—TVD), desired performance of the drilling system, and/or other such configuration constraints. In an example, FIG. 3 may be used in generating such constraints for operating within a prescribed region of a drilling operation space.

Figure 3:
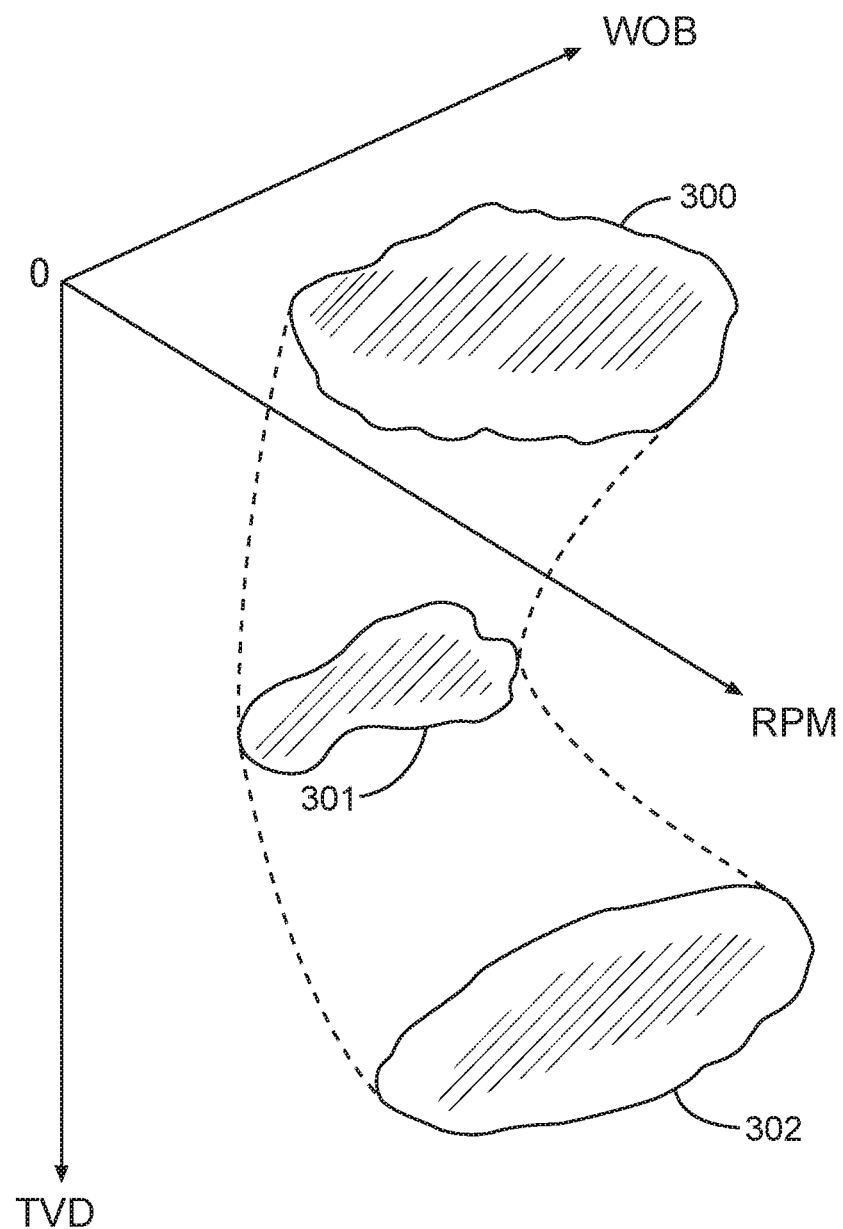
FIG. 3 is a diagram showing an embodiment of drilling constraints, according to various examples.

FIG. 3 is a diagram showing an embodiment of drilling constraints, according to various embodiments. This diagram is only one illustration of particular drilling constraints for operating within the prescribed region of the drilling operation space. Other examples may use other drilling constraints.

Referring to FIG. 3, an expected operating space 300-302 is defined using three drilling constraints such as weight-on-bit (WOB), drill bit revolutions per minute (RPM) and TVD. In other examples, the operating space may also include dog-leg severity, rate of penetration (ROP), and/or other drilling operating parameters and/or constraints.

Each of these drilling constraints is assigned to a different axis of the graph. The BHA should perform well within an operating region 300-302 (constraints) as defined by the drilling constraints. However, the operating region 300-302 is going to change based on a changing TVD. Thus, as the effectiveness of a given BHA configuration is simulated using the above-described model and as the drilling operation drills deeper into the geological formation, the operating region 300-302 changes dynamically with depth. The resulting constraints are dynamically changed and imposed on each iteration of the optimization of the cost function.

In an example, FIG. 3 shows an initial operating region of constraints 300. As the drill bit drills deeper, a second operating region of constraints 301 is generated. Similarly, as the drill bit drills even deeper, a third operating region of constraints 302 is generated. Each of these may be used in a respective iteration of the optimization of the cost function in order to dynamically update the optimization.

Referring again to FIG. 2, in block 203 a cost function is evaluated as described subsequently. The cost function is representative of the generated BHA configuration 201, dynamic drilling constraints 208 (see FIG. 3), the chosen dynamic model 204 (e.g., physics-based or data-based), and/or a respective weighting coefficient 206 for each of the dynamic drilling constraints 208 and for each of the terms in the cost function. The cost function is optimized by evaluating a plurality of iterations while dynamically updating the drilling constraints and/or weighting coefficients for each iteration. As described previously, the dynamic drilling constraints and/or weighting coefficients may change as the BHA descend deeper into the formation. An optimized function may be defined as a function having the smallest resulting value, relative to the resulting values of the other iterations, upon completion of execution of the iterations.

The optimized cost function may be defined as the following minimized integration of the drilling constraints and their respective weighting coefficients:

$$\min \int_0^t \{c_1|\text{Energy}| + c_2|\text{Vibrations}| + c_3|\text{Path Deviations}| + c_4|\text{Wear}| -$$
$$c_5|\text{Measurability}| - c_6|\text{Controllability}| + c_7(Cost) -$$
$$c_8(\text{Maneuverability}) - c_9(ROP) + c_{10}|\text{Historical Data}|\}dt$$

where $c_i \in [0,1]$, i=1, 2, 3, . . . , $\Sigma_{i=1}^{10} c_i = 1$, and "Energy, Vibrations, Path Deviations, Wear, Measurability, Controllability, Cost, Maneuverability, ROP, and Historical Data"

are considered to be drilling process metrics to be optimized. These drilling process metrics are for purposes of illustration only as other drilling process metrics may be used. The choice of the weighting coefficient, $c_i$, for each respective drilling process metric may be manually chosen or automatically chosen.

In an example of manually chosen weighting coefficients, a user may be interested only in maximizing ROP with minimal vibrations and may not find the energy input (Energy), drilling costs (Cost), etc. as important. In such a case, all $c_i$'s may be set to zero except for the weighting coefficients for Vibrations and ROP (i.e., $c_2$ and $c_9$).

In an example of automatically chosen weighting coefficients, the process would evaluate the desired drilling path. In a vertical drilling section, no maneuverability is used. Therefore the corresponding weighting coefficient for the drilling process metric of Maneuverability (i.e., $c_5$) may be automatically set to zero.

The Energy drilling process metric may include the total energy input to the drilling system. For example, Energy may include all of the electric, mechanical and hydraulic energies used for the drilling operation. An example mathematical description of the energy may be the mechanical specific energy (MSE), the total strain energy and the input energy and is given as:

$$\text{Energy} = MSE + \frac{1}{2}\left[\int_0^l \frac{N(x)^2}{E(x)A(x)}dx + \int_0^l \frac{M(x)^2}{E(x)I(x)}dx \int_0^l \frac{V(x)^2}{G(x)\frac{A(x)}{\alpha}}dx \int_0^l \frac{\tau(x)^2}{G(x)J(x)}dx\right]$$

where, MSE is given by, $$MSE = \frac{\text{Total input Energy}}{ROP}$$

and
E(x) is Young's Modulus
G(x) is Shear Modulus
A(x) is cross sectional area
I(x) is bending moment of inertia
J(x) is torsional moment of inertia $$\frac{A(x)}{\alpha}$$

is effective shear area
N(x) is the axial force
M(x) is the bending moment
V(x) is the shear force
$\tau(x)$ is the torque
u is the input The Vibrations drilling process metric may include various deteriorating downhole vibrations such as stick-slip, bit-whirl, bit-bounce, etc. As an example, the vibrations may be captured by Vibration energy, $E_v$:

$$E_v = \int_0^t \left(b_1\frac{\ddot{x}^2}{\ddot{x}_n^2} + b_2\frac{\ddot{y}^2}{\ddot{y}_n^2} + b_3\frac{\ddot{z}^2}{\ddot{z}_n^2} + b_4\frac{\ddot{\alpha}^2}{\ddot{\alpha}_n^2} + b_5\frac{\ddot{\beta}^2}{\ddot{\beta}_n^2} + b_6\frac{\ddot{\gamma}^2}{\ddot{\gamma}_n^2}\right)dt$$

where, x, y, z are the three translations and $\alpha$, $\beta$, $\gamma$ are the three rotations in the three dimensional drilling space. The variables, $v\ddot{a}r$ represent the second derivative of the translation and rotation variables, var, with time. Also, each of the vibrations may be scaled appropriately by a normalizing value such as $\ddot{x}_n$, $\ddot{y}_n$, ... etc. The normalizing is performed in order to appropriately scale the accelerations in various dimensions. Since a BHA may have multiple sensors to measure acceleration or other drilling parameters, the locations of the different sensors may be taken into account in choosing the normalizing parameters.

Also in the Vibration energy $E_v$ equation, $b_1$, $b_2$, $b_3$, ..., $b_6 \in [0,1] \ni \Sigma_{i=1}^6 b_i = 1$ are vibration weighting coefficients chosen based on the importance of vibrations along particular directions. For example, if the vibrations along all axes are important, then all weighting coefficients are chosen to be equal to a predetermined value (e.g., ⅙). In another example, one vibration weighting coefficients may be chosen to have a higher value (e.g., $b_6=1$) while the rest of the coefficients may be chosen to be zero (i.e., $b_i=0$). This gives importance to the vibrations in the rotary direction (i.e., stick-slip) while the rest are negligible by comparison.

The cost function also minimizes any deviations from the desired trajectory of drilling, along with minimizing the wear of various components of the BHA. An example representation of such deviations may be given as:

$$\text{dev} = \int_0^t[a_1(x^*-x)^2 + a_2(y^*-y)^2 + a_3(z^*-z)^2 + a_4(\alpha^*-\alpha)^3 + a_5(\beta^*-\beta)^2 + a_6(\gamma^*-\gamma)^2]dt$$

where, the * represents the desired value of the state and $a_1$, $a_2$, $a_3$, ..., $a_6 \in [0,1] \ni \Sigma_{i=1}^6 c_i = 1$ are weighting coefficients chosen based on the importance of deviations along a particular direction. As an example, if deviations along all axes are equally important, then all weighting coefficients would be chosen to be equal (e.g., ⅙).

The Measurability teen accounts for the locations of the sensors along the BHA such that physical states appropriate for control, optimization and/or fault detection are measured. It also takes the sensor uncertainty, noise, bias, resolution and drift (with time, temperature and other environmental conditions) into account to determine the most beneficial locations for the sensors.

The Controllability term accounts for the ability to control the BHA and improve the performance while reducing any physical limitations that may arise due to the design. It also includes the locations of various BHA components, such as the stabilizers, such that the BHA may operate in a constraint operating region that is easy to control.

The Maneuverability term should be maximized as that dictates the location of the RSS relative to the drill bit. Using the location and type of the RSS, the Maneuverability term takes into account the desired path geometry parameters (e.g., dog leg severity (DLS), tool face (TF), radius of curvature (ROC)), and optimizes the BHA configuration such that the desired path is achievable at relatively high efficiency and low cost.

The cost function also takes the Historical Data into account. The Historical Data may include, but not limited to, the formation type, BHA configurations used with a corresponding drilling performance, cost per foot of drilling, etc. These may be included as a separate term in the cost function or may be embedded into other described terms.

The rate of penetration, ROP is a function of the BHA design and selected components, such as drill bit type. Therefore, the design and components may be chosen such that highest possible ROP is achieved.

The ultimate goal of optimizing the cost function is to minimize the Cost of drilling. The Cost term may include component costs, assembly costs, and/or maintenance costs.

In block 205, it is determined if the cost function has been optimized according to the drilling criteria defined by the user 210. The drilling criteria may include a tolerance on energy, ROP, path deviation, etc., or it may be defined based on evaluating the optimal value of the cost function. One way to find the optimal values is to find the BHA configurations that drives the derivative to zero. The determination of air optimized cost function may be determined by comparing the cost function values of the present iteration with the values of other iterations. If this iteration of a particular BHA configuration produced the lowest cost function value, then that particular cost function is the optimal cost function. If the cost function has not been optimized, the process repeats from block 201 where another BHA configuration is generated with new configuration constraints 202 and another cost function iteration generated.

In block 213, if the final cost function is an optimal cost function, the BHA may be designed and assembled based on that final optimized configuration of the cost function.

In another example, an initial BHA configuration may be selected. Components of the initial BHA configuration may then be adjusted in order to change its respective cost function and generate the optimal cost function.

Figure 6:
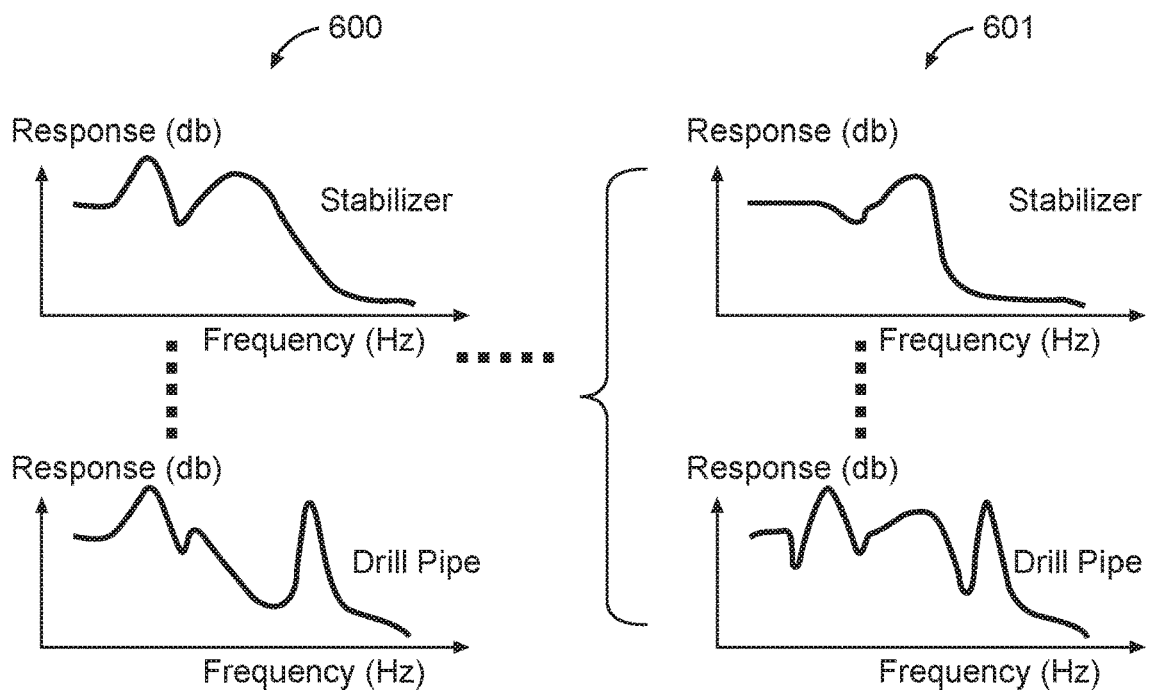
FIG. 6 is a plurality of graphs showing embodiments of actual and estimated frequency responses of various BHA components, according to various embodiments.
Figure 7:
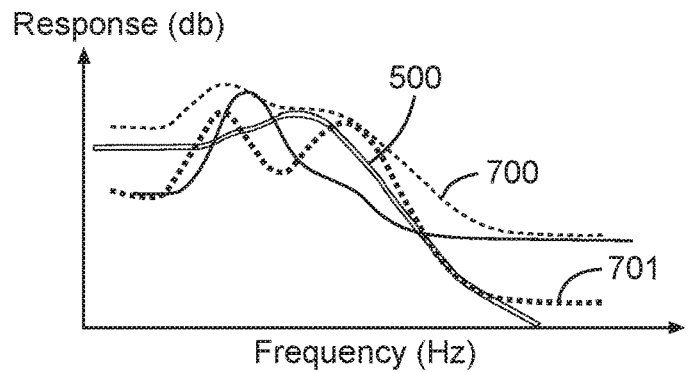
FIG. 7 is a graph showing a combined BHA component frequency response, according to various examples.

While FIG. 2 illustrates one example of performing BHA design optimization in the time domain, the BHA design optimization may also be accomplished in the frequency domain. The flowchart of FIG. 4 and the frequency response graphs of FIGS. 5-7 illustrate such a concept.

Figure 4:
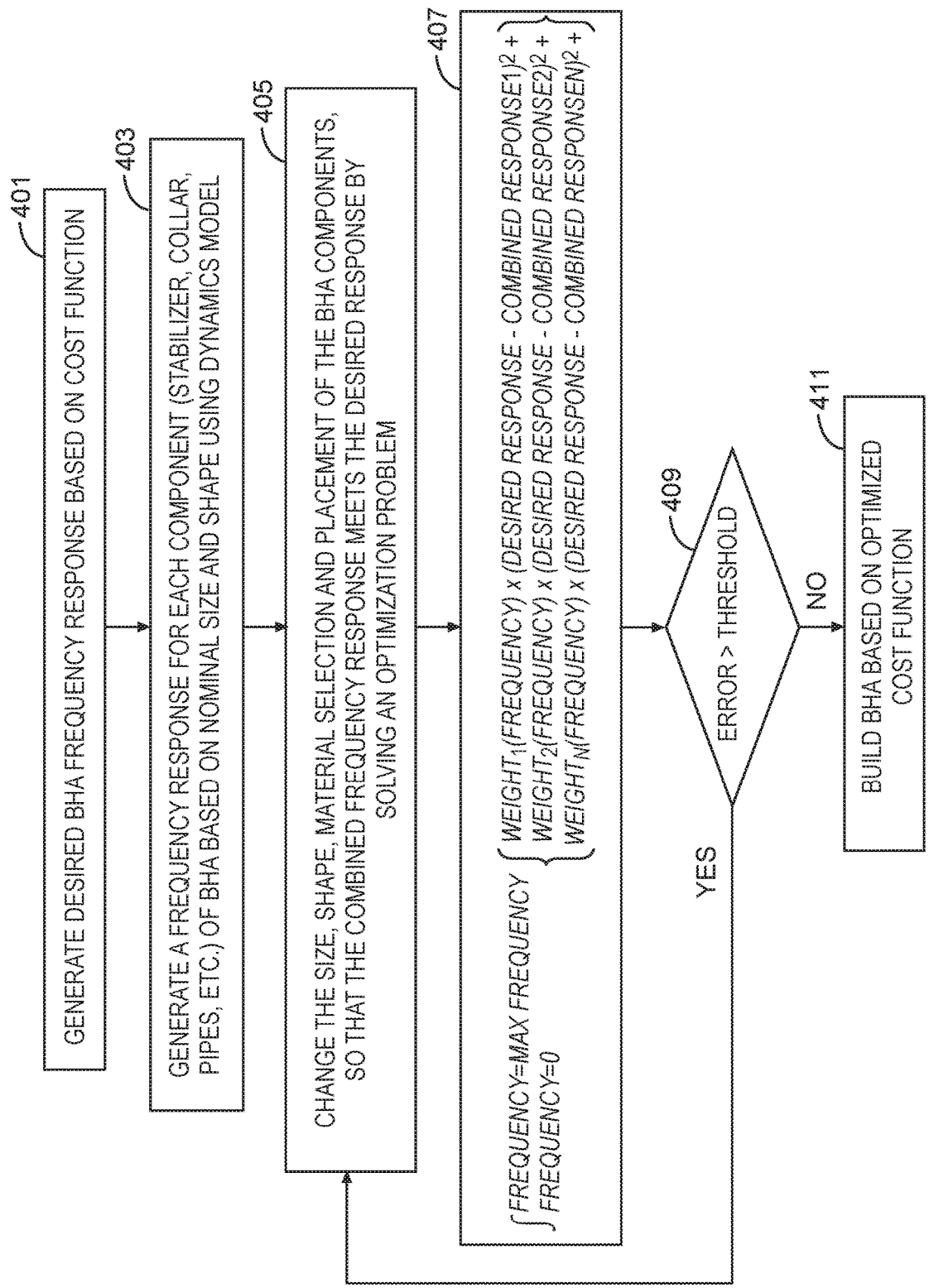
FIG. 4 is a flowchart of a method for BHA design in the frequency domain, according to various examples.

FIG. 4 is a flowchart of a method for BHA design in the frequency domain, according to various embodiments. This method may be read in conjunction with the frequency response graphs of FIGS. 5-7 that illustrate the desired system frequency response as well as the various BHA component frequency responses.

In block 401, a desired frequency response is generated for the BHA system. For example, desired frequency response is shown in FIG. 5.

Figure 5:
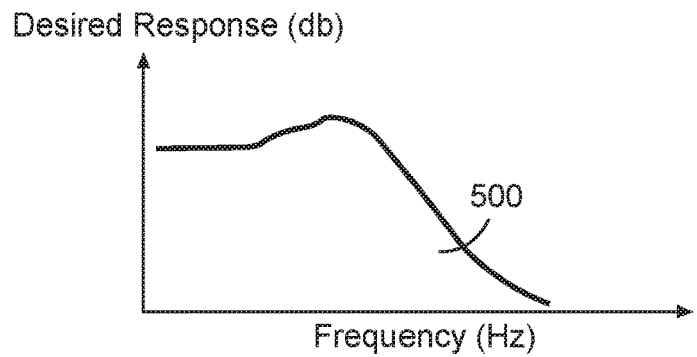
FIG. 5 is a graph showing a desired frequency response for the BHA configuration, according to various examples.

FIG. 5 is a graph showing a desired frequency response for the BHA configuration, according to various examples. The graphs shows the frequency (in Hertz (Hz)) along the x-axis and the desired response (in decibels (dB)) along the y-axis.

It can be seen in FIG. 5 that the response gain at a relatively low frequency range may be high in order to achieve acceptable tracking performance and has a relatively large bandwidth for fast response. The desired response can also incorporate criteria to mitigate disturbance sensitivity and reduce resonance magnitude.

The Desired Response illustrated in FIG. 5 and used subsequently in the optimization problem may be generated systematically by optimizing the cost function:

Minimize $\{(\text{Bandwidth} - \text{Bandwidth}^{Desired})^2 + (\text{Low Frequency Gain} - \text{Low Frequency Gain}^{Desired})^2 + (\text{Disturbance Sensitivity})^2 + (\text{Resonance Magnitude at Critical Frequency})^2\}$ where Bandwidth is the bandwidth of the actual frequency response, Bandwidth$^{Desired}$ is the desired bandwidth of the desired frequency response, Low Frequency Gain is the estimated low frequency response from the physics based or data driven model and Low Frequency Gain-Desired is desired gain in the low frequency region. Disturbance Sensitivity is a measure of the BHA response to disturbance. One exemplary way to define disturbance sensitivity is the response of BHA for unit disturbance input. Resonance Magnitude at Critical Frequency is response of the BHA when excited at these critical frequencies. The critical frequencies may be the natural frequencies of the BHA or a combination of them.

In block 403, the frequency response of each of the components of the BHA system (e.g., stabilizer, drill collar, pipe, drill bits) may be generated based on a nominal configuration of each component in a BHA using the dynamic model discussed previously. Such a concept is illustrated in the graphs of FIG. 6.

The component's nominal configuration, for example, may include a nominal size, shape and/or placement in the BHA. As used herein, a nominal configuration and nominal operating conditions may be defined using empirical data resulting from previous BHA designs and previous BHA operations.

FIG. 6 is a plurality of graphs showing embodiments of actual 600 and estimated 601 frequency responses of various BHA components, according to various examples. One column of graphs 600 illustrates the actual frequency responses of various BHA components (e.g., stabilizer, drill pipe) at nominal operating conditions (e.g., nominal temperature and pressure, relatively unused drill bit). The other column of graphs 601 illustrates the estimated frequency responses of those same BHA components at elevated operating conditions (e.g., relatively high temperature and pressure, different levels of drill bit wear), as compared to the nominal operating conditions.

Referring again to the flowchart of FIG. 4, in block 405 the size, shape, material selection, and component placement in the BHA are changed until the combined frequency response is substantially close to the desired frequency response. This is accomplished by solving an optimization problem such as Min {(Desired Response−Combined Response at possible operating conditions)$^2$ for each component.

The optimal BHA configuration (e.g., component size, shape, material, component placement sequence) can be determined by addressing the optimization problem, so that the combined frequency responses at different operating conditions can match the desired frequency response as close as possible. In block 407, the optimization problems for each component of the BHA are represented as a cost function in order to determine an error between the desired frequency response for the BHA (see, for example, FIG. 5) and the response of the current BHA configuration as generated in block 405. This cost function includes weighting coefficients for each executed for component optimization problem in order to adjust (i.e., reduce or increase) the affect that particular component's frequency response has on the overall cost function for the BHA. The cost function for N BHA components can be written as:

Minimize $$\int_{Frequency=0}^{Frequency=Max\ Frequency} \left\{ \begin{array}{l} \text{Weight}_1(\text{Frequency}) \times \\ (\text{Desired Response} - \text{Combined Response 1})^2 + \\ \text{Weight}_2(\text{Frequency}) \times \\ (\text{Desired Response} - \text{Combined Response 2})^2 + \ldots \\ \text{Weight}_N(\text{Frequency}) \times \\ (\text{Desired Response} - \text{Combined Response } N)^2 \end{array} \right\}$$

where Weight$_N$(Frequency) is the weighting coefficient at a given frequency range for each BHA component and the Max Frequency may be assumed to be infinity for a theoretical solution or Max Frequency may be the highest frequency possible in a downhole environment.

Each iteration of the cost function results in an error that is the difference between the desired frequency response for the BHA and the actual frequency response of the current BHA configuration. This error is compared to a desired threshold in block 409. If the error is greater than the threshold, the method returns to generate another BHA configuration in block 405 having different size, shape and placement of BHA components. The optimized cost function for that particular BHA configuration is then determined and the process repeats. In block 411, the BHA may then be designed and built based on the optimized cost function. Thus, the optimized cost function has the smallest error of all of the iterations (i.e., the error is minimized).

The error threshold may not be zero. A higher error threshold may result in greater damage and/or wear to the BHA than a lower error threshold. However, if the error threshold is too low, there may not be a BHA configuration that results in a frequency response that exactly matches the desired frequency response. Thus, a trade-off may be made between achieving a low threshold that is still achievable.

FIG. 7 is a graph showing combined BHA component frequency responses, according to various examples. The desired frequency response 500 from FIG. 5 is included for reference.

The graph shows an estimated combined frequency response curve 700 at various different operating conditions. This curve 700 is a combination of the estimated frequency response curves 601 of FIG. 6.

The graph also shows an actual combined frequency response curve 701 at nominal conditions. This curve 701 is a combination of the actual frequency response curves 600 of FIG. 6.

The combined BHA component frequency response is generated by combining the BHA component frequency responses with different configurations of the size, shape, material selection and placement of the BHA components. This may be referred to as an expected overall BHA frequency response. Note that for a specific configuration of BHA components, there could be multiple combined frequency responses accounting for various operating conditions (e.g., temperature, pressure, drill bit wear).

Figure 8:
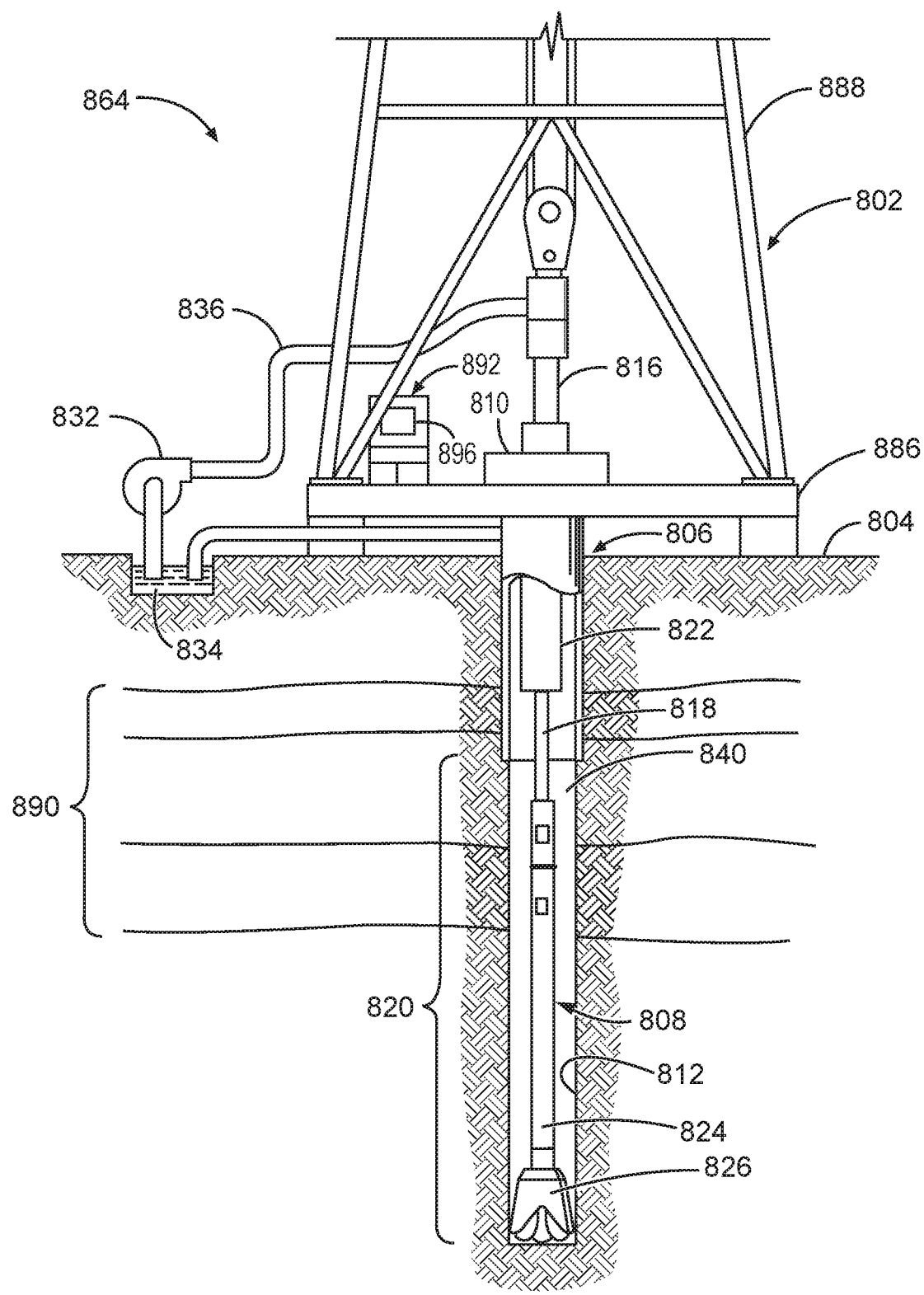
FIG. 8 is a diagram showing a drilling system, according to various examples of the disclosure.

FIG. 8 is a diagram showing a drilling system 864, according to various examples of the disclosure. The system 864 includes a drilling rig 802 located at the surface 804 of a well 806. The drilling rig 802 may provide support for a drill string 808. The drillstring 808 may operate to penetrate the rotary table 810 for drilling the borehole 812 through the subsurface formations 814. The drillstring 808 may include a drill pipe 818 and the bottom hole assembly (BHA) 820 (e.g., drill string), perhaps located at the lower portion of the drill pipe 818.

The BHA 820 may include drill collars 822, a down hole tool 824, stabilizers, sensors, an RSS, a drill bit 826, as well as other possible components. The drill bit 826 may operate to create the borehole 812 by penetrating the surface 804 and the subsurface formations 814.

During drilling operations within the cased borehole 812, the drillstring 808 (perhaps including the drill pipe 818 and the BHA 820) may be rotated by the rotary table 810. Although not shown, in addition to or alternatively, the BHA 820 may also be rotated by a motor (e.g., a mud motor) that is located down hole. The drill collars 822 may be used to add weight to the drill bit 826. The drill collars 822 may also operate to stiffen the bottom hole assembly 820, allowing the bottom hole assembly 820 to transfer the added weight to the drill bit 826, and in turn, to assist the drill bit 826 in penetrating the surface 804 and subsurface formations 814.

During drilling operations within the cased borehole 812, a mud pump 832 may pump drilling fluid (sometimes known by those of ordinary skill in the art as "drilling mud") from a mud pit 834 through a hose 836 into the drill pipe 818 and down to the drill bit 826. The drilling fluid can flow out from the drill bit 826 and be returned to the surface 804 through an annular area 840 between the drill pipe 818 and the sides of the borehole 812. The drilling fluid may then be returned to the mud pit 834, where such fluid is filtered. In some examples, the drilling fluid can be used to cool the drill bit 826, as well as to provide lubrication for the drill bit 826 during drilling operations. Additionally, the drilling fluid may be used to remove subsurface formation cuttings created by operating the drill bit 826.

A workstation 892 including a controller 896 may include modules comprising hardware circuitry, a processor, and/or memory circuits that may store software program modules and objects, and/or firmware, and combinations thereof that are configured to execute the methods of FIGS. 2 and 4 in designing and optimizing a BHA. The workstation 892 and controller 896 are shown near the rig 802 only for purposes of illustration as these components may be located at remote locations.

These implementations can include a machine-readable storage device having machine-executable instructions, such as a computer-readable storage device having computer-executable instructions. Further, a computer-readable storage device may be a physical device that stores data represented by a physical structure within the device. Such a physical device is a non-transitory device. Examples of a non-transitory computer-readable storage medium can include, but not be limited to, read only memory (ROM), random access memory (RAM), a magnetic disk storage device, an optical storage device, a flash memory, and other electronic, magnetic, and/or optical memory devices.

Figure 9:
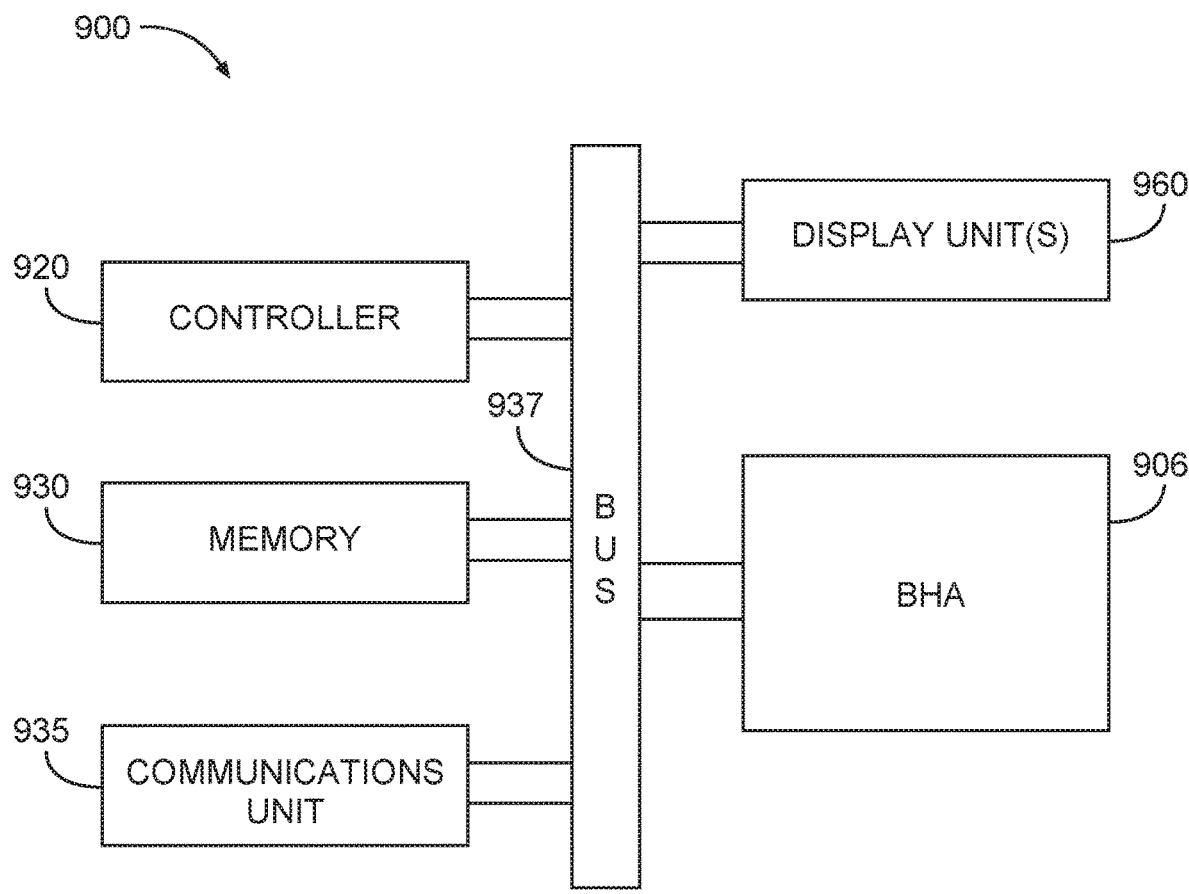
FIG. 9 is a block diagram of an example system operable to implement the activities of multiple methods, according to various examples of the disclosure.

FIG. 9 is a block diagram of an example system 900 operable to implement the activities of disclosed methods, according to various examples of the disclosure. The system 900 may include a BHA 906 such as that illustrated in FIG. 1. The system 900 may be configured to operate in accordance with the teachings herein to generate an optimized BHA design. The system 900 of FIG. 9 may be implemented as shown in FIG. 8 with reference to the workstation 892 and controller 896.

The system 900 may include a controller 920, a memory 930, and a communications unit 935. The memory 930 may be structured to include a database. The controller 920, the memory 930, and the communications unit 935 may be arranged to execute any methods disclosed herein.

The communications unit 935 may include downhole communications for appropriately located sensors in a wellbore. Such downhole communications can include a telemetry system. The communications unit 935 may use combinations of wired communication technologies and wireless technologies at frequencies that do not interfere with on-going measurements.

The system 900 may also include a bus 937, where the bus 937 provides electrical conductivity among the components of the system 900. The bus 937 can include an address bus, a data bus, and a control bus, each independently configured or in an integrated format. The bus 937 may be realized using a number of different communication mediums that allows for the distribution of components of the system 900. The bus 937 may include a network. Use of the bus 937 may be regulated by the controller 920.

The system 900 may include display units) 960 as a distributed component on the surface of a wellbore, which may be used with instructions stored in the memory 930 to implement the methods disclosed herein. The user interface may be used to input parameter values for thresholds such that the system 900 can operate autonomously substantially without user intervention in a variety of applications. The user interface may also provide for manual override and change of control of the system 900 to a user. Such a user interface may be operated in conjunction with the communications unit 935 and the bus 937. Many examples may thus be realized. A few examples of such examples will now be described.

Example 1 is a method for selection of a bottomhole assembly (BHA) configuration comprising: creating a plurality of BHA configurations; determining a cost function representative of each respective BHA configuration, each cost function comprising drilling process metrics; and selecting a final BHA configuration of the plurality of BHA configurations having an optimal cost function value, wherein the optimal cost function value is less than cost function values of other respective cost functions for the plurality of BHA configurations.

In Example 2, the subject matter of Example 1 can further include selecting an initial BHA configuration; and configuring components of the initial BHA configuration to adjust its respective cost function and generate the optimal cost function.

In Example 3, the subject matter of Examples 1-2 can further include optimizing the cost function of each respective BHA configuration through a plurality of iterations based on the respective BHA configuration, drilling model, and/or respective drilling process metrics and weighting coefficients.

In Example 4, the subject matter of Examples 1-3 can further include wherein the BHA drilling process metrics comprise at least one of Energy, Vibrations, Path Deviations, Wear, Measurability, Controllability, Cost, Maneuverability, Rate of Penetration, or Historical Data.

In Example 5, the subject matter of Examples 1-4 can further include wherein updating the weighting coefficients comprises determining the weighting coefficients manually or automatically.

In Example 6, the subject matter of Examples 1-5 can further include constructing a BHA based on the selected final BHA configuration, wherein the selected final BHA configuration is representative of locations and types of BHA components.

In Example 7, the subject matter of Examples 1-6 can further include wherein the cost functions are evaluated in time domain or frequency domain.

In Example 8, the subject matter of Examples 1-7 can further include generating a desired BHA frequency response based on the respective cost function of the BHA configuration and/or frequency domain drilling process metrics; generating a frequency response for each component in the BHA; generating a plurality of combined frequency responses, each combined frequency response comprising a combination of the frequency responses for the components in the BHA, wherein each frequency response is represented by a respective cost function; determining an error between each combined frequency response and the desired frequency response; and selecting the final BHA configuration based on the error being minimized.

In Example 9, the subject matter of Examples 1-8 can further include wherein generating a frequency response for each component in the BHA comprises: generating a set of actual frequency responses for each component for nominal operating conditions; and generating a set of estimated frequency responses for each component for elevated operating conditions.

In Example 10, the subject matter of Examples 1-9 can further include wherein the frequency domain drilling process metrics comprise at least one of allowable bandwidth, disturbance sensitivity, frequency gains or resonance amplitude.

In Example 11, the subject matter of Examples 1-10 can further include wherein each of the BHA configurations is based on BHA configuration constraints.

Example 12 is a non-transitory computer readable medium that stores instructions for execution by processing circuitry to perform operations to generate a bottom hole assembly (BHA) configuration, the operations comprising: create a plurality of BHA configurations; determine a cost function representative of each respective BHA configuration, each cost function comprising drilling process metrics; and select a final BHA configuration of the plurality of BHA configurations having an optimal cost function value, wherein the optimal cost function value is less than cost function values of other representative cost functions for the plurality of BHA configurations.

In Example 13, the subject matter of Example 12 can further include wherein each cost function is respectively generated by a dynamic model, a plurality of dynamic BHA drilling process metrics, and a plurality of weighting coefficients, the operations further multiply each dynamic drilling constraint by its associated weighting coefficient in a time domain.

Example 14, the subject matter of Examples 12-13 can further include further comprising estimating downhole vibration and drilling path deviation based on the dynamic model.

In Example 15, the subject matter of Examples 12-14 can further include wherein the dynamic model is physics-based or data-based.

In Example 16, the subject matter of Examples 12-15 can further include wherein the dynamic model is represented by position and attitude vectors of mass, damping and inertia properties of each component of the BHA.

Example 17 is a method comprising: generating a desired bottom hole assembly (BHA) frequency response based on a cost function; estimating downhole vibrations and drilling path deviations based on a dynamic model; generating a frequency response for each component of the BHA based on nominal size, shape, and materials of each component; and changing a combined frequency response, comprising the frequency response for each component, by, changing the size, shape, and material of the components of the BHA until an error between the combined frequency response and the desired BHA frequency response is less than a threshold.

In Example 18, the subject matter of Example 17 can further include wherein changing the combined frequency response comprises executing an optimization problem defined as min {(Desired Response−Combined Response at all possible operating conditions)2 wherein Desired Response represents the desired BHA frequency response and Combined Response at all possible operating conditions represents a combination of the frequency responses for all of the components of the BHA.

In Example 19, the subject matter of Examples 17-18 can further include wherein the combination of the frequency responses for all of the components of the BHA includes actual component frequency responses at nominal operating conditions and estimated component frequency responses at elevated operating conditions.

In Example 20, the subject matter of Examples 17-19 can further include wherein the error is generated by multiplying a weighting coefficient for a predetermined frequency range with the optimization problem.

Although specific examples have been illustrated and described herein, it will be appreciated by those of ordinary skill in the art that any arrangement that is calculated to achieve the same purpose may be substituted for the specific examples shown. Various examples use permutations and/or combinations of examples described herein. It is to be understood that the above description is intended to be illustrative, and not restrictive, and that the phraseology or terminology employed herein is for the purpose of description. Combinations of the above examples and other examples will be apparent to those of skill in the art upon studying the above description.

What is claimed is:

1. A method for selection of a bottomhole assembly (BHA) configuration comprising:
    creating a plurality of BHA configurations;
    determining a cost function representative of each respective BHA configuration, each cost function comprising drilling process metrics;
    selecting a final BHA configuration of the plurality of BHA configurations having an optimal cost function value, wherein the optimal cost function value is less than cost function values of other respective cost functions for the plurality of BHA configurations, wherein selecting the final BHA configuration comprises: generating a desired BHA frequency response based on the respective cost function of the BHA configuration and/or frequency domain drilling process metrics; generating a frequency response for each component in the BHA; generating a plurality of combined frequency responses, each combined frequency response comprising a combination of the frequency responses for the components in the BHA, wherein each frequency response is represented by a respective cost function; determining an error between each combined frequency response and the desired frequency response; and selecting the final BHA configuration based on the error being minimized; and
    constructing a BHA based on the selected final BHA configuration, wherein the selected final BHA configuration is representative of locations and types of BHA components.

2. The method of claim 1, further comprising: selecting an initial BHA configuration; and configuring components of the initial BHA configuration to adjust its respective cost function and generate the optimal cost function.

3. The method of claim 1, further comprising optimizing the cost function of each respective BHA configuration through a plurality of iterations based on the respective BHA configuration, drilling model, and/or respective drilling process metrics and weighting coefficients.

4. The method of claim 3, wherein the BHA drilling process metrics comprise at least one of Energy, Vibrations, Path Deviations, Wear, Measurability, Controllability, Cost, Maneuverability, Rate of Penetration, or Historical Data.

5. The method of claim 2, wherein updating the weighting coefficients comprises determining the weighting coefficients manually or automatically.

6. The method of claim 1, wherein the cost functions are evaluated in time domain or frequency domain.

7. The method of claim 1, wherein generating a frequency response for each component in the BHA comprises: generating a set of actual frequency responses for each component for nominal operating conditions; and generating a set of estimated frequency responses for each component for elevated operating conditions.

8. The method of claim 1, frequency domain drilling process metrics comprise at least one of allowable bandwidth, disturbance sensitivity, frequency gains or resonance amplitude.

9. The method of claim 1, wherein each of the BHA configurations is based on BHA configuration constraints.

10. The method of claim 1, wherein generating the desired BHA frequency response includes reducing a vibrational magnitude of each of the BHA.

11. A non-transitory computer readable medium that stores instructions for execution by processing circuitry to perform operations to generate a bottom hole assembly (BHA) configuration, the operations comprising:
    create a plurality of BHA configurations;
    determine a cost function representative of each respective BHA configuration, each cost function comprising drilling process metrics;
    select a final BHA configuration of the plurality of BHA configurations having an optimal cost function value, wherein the optimal cost function value is less than cost function values of other representative cost functions for the plurality of BHA configurations, wherein selecting the final BHA configuration comprises: generating a desired BHA frequency response based on the respective cost function of the BHA configuration and/or frequency domain drilling process metrics; generating a frequency response for each component in the BHA; generating a plurality of combined frequency responses, each combined frequency response comprising a combination of the frequency responses for the components in the BHA, wherein each frequency response is represented by a respective cost function; determining an error between each combined frequency response and the desired frequency response; and selecting the final BHA configuration based on the error being minimized; and
    constructing a BHA based on the selected final BHA configuration, wherein the selected final BHA configuration is representative of locations and types of BHA components.

12. The non-transitory computer-readable medium of claim 11, wherein each cost function is respectively generated by a dynamic model, a plurality of dynamic BHA drilling process metrics, and a plurality of weighting coefficients, the operations further multiply each dynamic drilling constraint by its associated weighting coefficient in a time domain.

13. The non-transitory computer-readable medium of claim 12, further comprising estimating downhole vibration and drilling path deviation based on the dynamic model.

14. The non-transitory computer-readable medium of claim 13, wherein the dynamic model is physics-based or data-based.

15. The non-transitory computer-readable medium of claim 14, wherein the dynamic model is represented by position and attitude vectors of mass, damping and inertia properties of each component of the BHA.

* * * * *

UNITED STATES PATENT AND TRADEMARK OFFICE
CERTIFICATE OF CORRECTION

Page 1 of 1

PATENT NO. : 10,878,145 B2
APPLICATION NO. : 15/777167
DATED : December 29, 2020
INVENTOR(S) : Jason D. Dykstra et al.

It is certified that error appears in the above-identified patent and that said Letters Patent is hereby corrected as shown below:

In the Specification

Column 6, Line 37, change "teen" to -- term --

Column 7, Line 11, change "air" to -- an --

Column 8, Line 34, change "at possible" to -- at all possible --

Column 9, Line 51, change "drill string" to -- drillstring --

Column 11, Line 4, change "units)" to -- unit(s) --

Column 12, Line 35, add "In" before -- Example --

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*